United States Patent
Okuma

(10) Patent No.: US 7,839,217 B2
(45) Date of Patent: Nov. 23, 2010

(54) HIGH-FREQUENCY AMPLIFIER, HIGH-FREQUENCY MODULE, AND MOBILE WIRELESS APPARATUS USING THE SAME

(75) Inventor: Yasuyuki Okuma, Hachioji (JP)

(73) Assignee: Hitachi Metals, Ltd., Tokyo (JP)

( * ) Notice: Subject to any disclaimer, the term of this patent is extended or adjusted under 35 U.S.C. 154(b) by 79 days.

(21) Appl. No.: 12/314,426

(22) Filed: Dec. 10, 2008

(65) Prior Publication Data

US 2009/0146741 A1   Jun. 11, 2009

(30) Foreign Application Priority Data

Dec. 11, 2007 (JP) ............................. 2007-319512
Sep. 19, 2008 (JP) ............................. 2008-240697

(51) Int. Cl.
*H03F 3/04* (2006.01)
(52) U.S. Cl. ......................................... 330/296; 455/78
(58) Field of Classification Search .................. 330/285, 330/296; 455/78
See application file for complete search history.

(56) References Cited

U.S. PATENT DOCUMENTS

| | | | |
|---|---|---|---|
| 5,844,445 A | 12/1998 | Takeyari | |
| 6,510,309 B1 * | 1/2003 | Thompson et al. | ............ 455/78 |
| 7,365,604 B2 * | 4/2008 | Luo et al. | .................. 330/296 |
| 2003/0102924 A1 | 6/2003 | Matsumoto et al. | |
| 2005/0134359 A1 | 6/2005 | Lopez et al. | |
| 2005/0179484 A1 | 8/2005 | Sasho et al. | |

FOREIGN PATENT DOCUMENTS

| | | |
|---|---|---|
| JP | 09-130157 | 10/1995 |
| JP | 11-068473 | 8/1997 |
| JP | 2001-094362 | 9/1999 |
| JP | 2001-284984 | 3/2000 |
| JP | 2002-100937 | 9/2000 |
| JP | 2005-228196 | 2/2004 |
| JP | 2005-184838 | 12/2004 |

OTHER PUBLICATIONS

E. Taniguchi et al., "Dual Bias Feed SiGe HBT Low Noise Linear Amplifier", The Institute of Electronics, Information and Communication Engineers, Technical Report of IEICE. MW2001-25, OPE2001-12 (Jun. 2001), pp. 1-5, 64, in Japanese with English translation.

* cited by examiner

*Primary Examiner*—Steven J Mottola
(74) *Attorney, Agent, or Firm*—Stites & Harbison, PLLC; Juan Carlos A. Marquez, Esq

(57) ABSTRACT

A high-frequency amplifier with high linearity is provided that is easy to integrate and is resistant to variations in transistor characteristics due to process variation. The high-frequency amplifier includes a bias circuit to bias an amplifying element that amplifies high frequencies. The bias circuit has a feedback circuit including a feedback loop in which a circuit with low pass characteristics and having a capacitor one end of which is grounded is inserted. A stable bias voltage is thus provided, which makes it possible to improve the linearity of the high-frequency amplifier.

21 Claims, 16 Drawing Sheets

HIGH-FREQUENCY AMPLIFIER, HIGH-FREQUENCY MODULE, AND MOBILE WIRELESS APPARATUS USING THE SAME

CLAIM OF PRIORITY

The present application claims priority from Japanese Patent Applications JP 2007-319512 filed on Dec. 11, 2007, and JP 2008-240697 filed on Sep. 19, 2008, those contents are hereby incorporated by reference into this application.

FIELD OF THE INVENTION

The present invention relates to a high-frequency amplifier, a high-frequency module, and a mobile wireless apparatus using the same, and more particularly to those suitable for wireless communications employing the CDMA, OFDM (Orthogonal Frequency Division Multiplexing) scheme or an extended scheme thereof.

BACKGROUND OF THE INVENTION

Conventionally, there are known high-frequency amplifiers such as those described in JP-B Nos. 3125723 and 3514720, JP-A Nos. 2005-228196, H09-130157, 2001-94362, 2001-284984, and 2005-184838.

JP-B No. 3125723 discloses, as a high-frequency amplifier, a bias circuit for an emitter-grounded amplifier circuit wherein a bias circuit for bipolar transistors to amplify signals has a feedback loop configuration, and a resistor for self-bias is removed that was grounded to this bias circuit. According to JP-B No. 3125723, it is possible to make input resistance as viewed from the input terminal substantially large by removing the resistor in the bias circuit.

FIG. 5 of JP-B No. 3514720 discloses a power amplifier wherein a distortion compensation diode is connected via a first resistor between the base and base bias feed terminals of a signal amplifying bipolar transistor 101, and the connection point of the first resistor and the distortion compensation diode is grounded via a temperature compensation diode. According to JP-B No. 3514720, variations of the bias point can be suppressed by this configuration even when temperature changes.

FIG. 1 of JP-A No. 2005-228196 discloses a bias voltage supply circuit having a bias voltage supply point connected to the base of a high-frequency amplifier transistor and a constant voltage source, and wherein a rectifier transistor and a constant current source are connected to the bias voltage supply point. According to JP-A No. 2005-228196, since the bias voltage supply circuit has bias characteristics that the input power increases until its peak and then drops, it is possible to provide a high-frequency amplifier circuit with excellent saturation characteristics.

FIG. 5 of JP-A No. H09-130157 discloses a pre-amplifier (a current-voltage converter) having a feedback loop including a current signal input means, a signal amplifier transistor, and a control current source that is connected to the input means to shunt the current signals. According to JP-A No. H09-130157, this configuration allows an average output potential to be made constant by automatic adjustment of the current distribution ratio when a large amount of current is input.

JP-A No. 2001-94362 discloses a transmission amplifier wherein a transistor with the collector and base thereof connected together is used as a parent-side transistor constituting a current mirror, and a low-pass filter is composed of an out-of-chip inductor connected to the bases of a pair of transistors and a capacitor connected between the base and emitter of the parent-side transistor. According to JP-A No. 2001-94362, this configuration prevents high-frequency signals from being input to the parent-side transistor and thereby prevents a drop in the base bias potential even at a high output, thus making it possible to realize a high-output transmission amplifier.

JP-A No. 2001-284984 discloses a power amplifier module including an amplifier to power-amplify an input signal; a reference amplifier that includes a current mirror circuit and generates the DC component of an input signal corresponding to the input power level; and a DC amplifier (a dummy circuit) to amplify and supply this DC component to the amplifier. According to JP-A No. 2001-284984, it is possible to reproducibly realize a high-efficiency and low-distortion power amplifier module.

JP-A No. 2005-184838 discloses a semiconductor device including a bias generator connected to the gate terminal of a MOS transistor; a low-pass filter circuit connected between the input signal input section and the bias generator; and a high pass filter circuit connected between the input section and the gate terminal of the MOS transistor. The invention disclosed in JP-A No. 2005-184838 is intended to provide a technology to correctly compensate for the variations of bias condition in a MOS device attributable to device temperature variations and/or process variations.

Also, there is known an amplifier having a dual bias feed circuit as described in Eiji Taniguchi et al. "Dual bias feed SiGe HBT linear low-noise amplifier", IECE Journal MW2001-25, OPE2001-12 (2001-06), pp. 1-5. FIGS. 12 and 14 herein show the circuits disclosed in this document. That is, this document refers to the inductor bias feed circuit 710 and the resistor bias feed circuit 810 shown in FIGS. 12 and 13, and proposes the dual bias feed circuit shown in FIG. 14.

In FIG. 12, 701 to 703 denote transistors, 704 denotes a resistor, and 705 denotes an inductor. In FIG. 13, 801 to 803 denote transistors, 804 denotes a capacitor, 805 to 808 denote resistors, and 830 to 831 denote matching circuits. The dual bias feed circuit in FIG. 14 is a combination of the resistor bias feed circuit 810 and the diode bias feed circuit 910. The diode bias feed circuit 910 includes transistors 901 to 903 and a resistor 904. According to the Taniguchi, linearity of the resistor bias feed circuit is improved by introducing the dual bias feed circuit.

SUMMARY OF THE INVENTION

As recent wireless communication standards, digital modulation schemes such as CDMA and OFDM are employed for many mobile wireless communications including wireless LAN and WiMAX. These digital modulation schemes require amplifiers with high linearity.

In other words, unlike the conventional FSK-based GMSK scheme in which the power of a high-frequency signal does not vary with time, the CDMA and OFDM schemes are characterized in that the power of a high-frequency signal varies with time and a peak value is much larger that an average value. Particularly, since in the OFDM scheme a carrier wave with N different frequencies are multiplexed and also the frequency interval between signals is narrow, a peak power value of the multiplexed signals becomes 5 to 16 times larger (7 to 12 dB) than an average power value, as shown in FIG. 10.

Therefore, an amplifier used to amplify analog signals in which the difference between peak power value and average power value is large requires high linearity for input signals over the wide range from small signal operation to large signal operation.

However, conventional high-frequency amplifiers have not given sufficient consideration to this requirement.

That is, for the digital modulation scheme such as OFDM, the amplifier disclosed in JP-B No. 3125723 inevitably causes a potential drop at the bias point during the large signal operation, and hence it seems difficult to achieve high linearity for a wide range of high-frequency input signals.

Similarly, the amplifiers disclosed in JP-B No. 3514720 and JP-A No. 2005-228196 also cause a potential drop at the bias point for a wide range of high-frequency input signals and it seems difficult to achieve high linearity for such input signals.

Further, since the feedback loop of the current-voltage converter disclosed in JP-A No. H09-130157 is for regulating the input impedance in the entire circuit and does not have a function of controlling a potential at the bias point of a signal amplifier transistor, it seems difficult to achieve high linearity for a wide range of high-frequency input signals.

The low-pass filter disclosed in JP-A No. 2001-94362 is provided outside of the feedback loop. In addition, the inductor is external to the semiconductor integrated circuit and hence it seems difficult to integrate and downsize the circuit.

Also, if the inductor of the low-pass filter disclosed in JP-A No. 2001-94362 is replaced with resistor to integrate into the semiconductor integrated circuit, this resistor will increase the output impedance of the bias circuit and result in a drop in the base bias current when large power is input, which seems to be a problem in downsizing the circuit.

Similarly, the power amplifier module disclosed in JP-A No. 2001-284984 includes a dummy amplifier in addition to the reference amplifier, which seems to be a problem in downsizing the circuit.

Further, although the semiconductor device disclosed in JP-A No. 2005-184838 has a low-pass filter to separate the reference voltage for the bias circuit from the high-frequency signals and DC currents mixed outside of the chip, this low-pass filter is located outside of the feedback loop of the bias circuit and it seems difficult to achieve high linearity for a wide range of input signals in this configuration.

In contrast, in the example of the Taniguchi shown in FIG. 14 herein, a capacitor 804 exists in the bias circuit of the resistor bias feed circuit 810. This capacitor 804 is for preventing oscillations of the bias circuit and is designed to be at as low cutoff frequency as possible. In many cases, the cutoff frequency is designed to be at about a few KHz. Further, during a large signal operation, the resistor 806 is series-connected to the capacitor 804 and not grounded for high frequencies, as shown in the large signal equivalent circuit of FIG. 15, and therefore sufficient signal attenuation cannot be achieved.

Hence, signals are input to the base of the transistor 802 even at high frequencies above the cutoff frequency and transmitted to the output of the transistor 802 and then to the base of the transistor 803, causing the output of the transistor 803 to vary. For this reason, a potential drop occurs at the bias point 820 during the large signal operation. Because of this, it is assumed to be difficult to achieve high linearity for a wide range of input signals by means of the resistor bias feed circuit.

Based on this, the Taniguchi proposes a dual bias feed circuit wherein linearity has been improved by combining two types of bias circuits 810 and 910 as shown in FIG. 14 herein. However, this dual bias feed circuit in the Taniguchi becomes twice as large as the resistor bias feed circuit, which is a problem in downsizing. That is, circuit size increase resulting from the combination of two types of circuits makes it difficult to downsize the circuit.

An object of the present invention is therefore to provide a high-frequency amplifier and a high-frequency module having high linearity for a wide range of input signals without increasing the circuit size, and a mobile wireless application using them.

According to an exemplary embodiment of the invention, a high-frequency amplifier of the present invention for example includes an input terminal and an output terminal for high-frequency signals; a high-frequency amplifier transistor with the base connected to the input terminal; and a bias circuit that biases the base of the high-frequency amplifier transistor and has a feedback loop constituting a current mirror, and wherein a low-pass filter including a capacitor is inserted in the feedback loop of the bias circuit; and wherein the capacitor constitutes at least part of a shunt circuit to ground the feedback loop.

According to the present invention, it is possible to provide a high-frequency amplifier and a high-frequency module that have a high linearity and are easy to integrate and have resistance to variations in transistor characteristics due to process variation, without increasing the circuit size, and a mobile wireless appliance using them.

DETAILED DESCRIPTION OF THE PREFERRED EMBODIMENTS

According to a typical embodiment, in a high-frequency amplifier provided with a bias circuit to bias a high-frequency amplifier transistor, the bias circuit includes a feedback circuit whose feedback loop contains a low-pass filter having a capacitor one end of which is grounded. Because of this, no feedback is made to the transistor 803 when the frequency of an input signal is above the cutoff frequency and thereby a stable bias voltage is supplied to the high-frequency amplifier transistor, which makes it possible to improve the linearity of the high-frequency amplifier even when the input signal level increases.

Typical embodiments are described below with reference to the accompanying drawings.

First Embodiment

Figure 1:
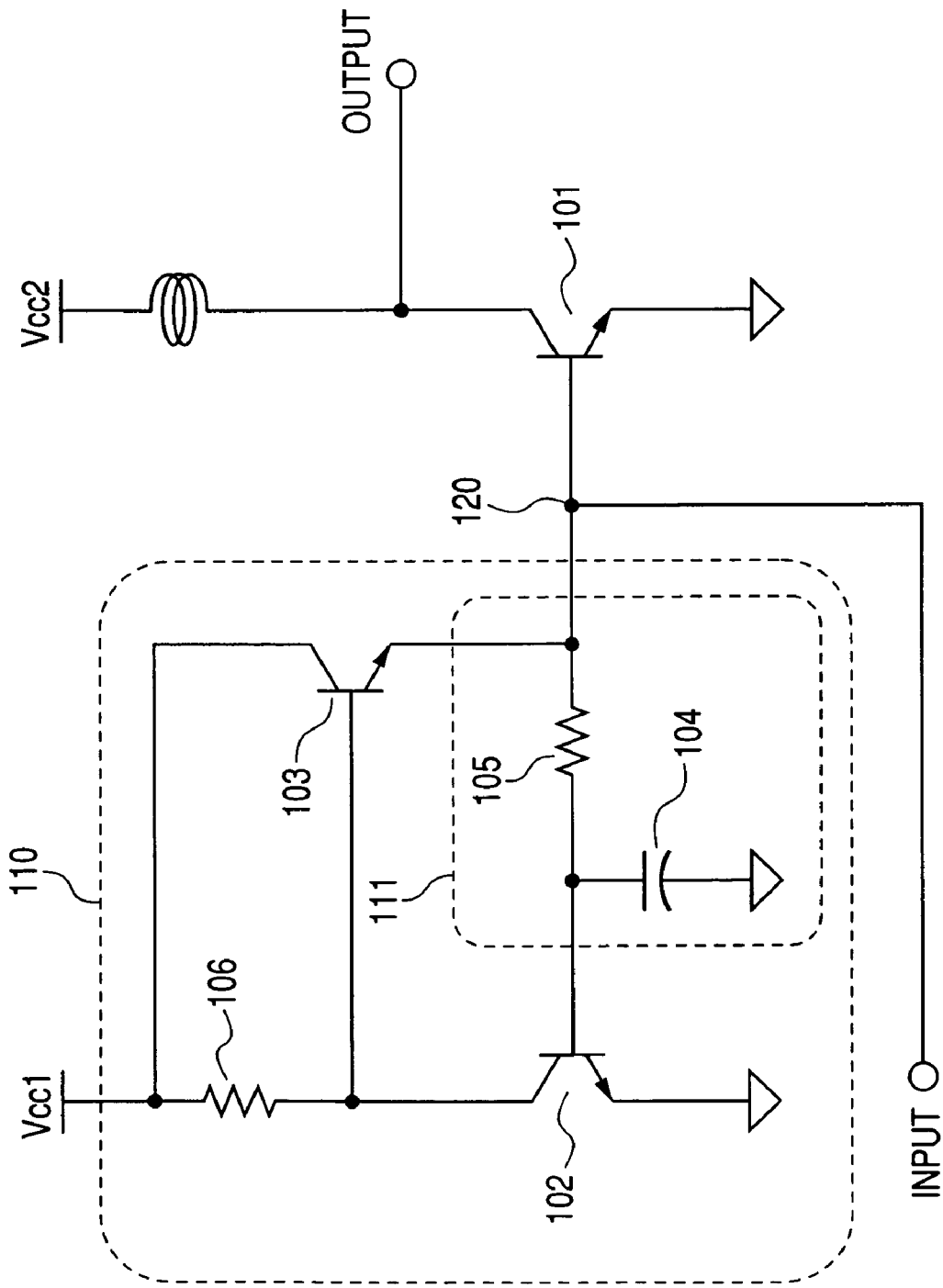
FIG. 1 is a diagram showing a configuration of a high-frequency amplifier according to a first embodiment of the present invention.

FIG. 1 is a circuit diagram showing a configuration of a high-frequency amplifier according to a first embodiment. The high-frequency amplifier of this embodiment includes an amplifying operation transistor (a first transistor) 101 that amplifies and outputs input signals; and a bias circuit 110 that supplies bias voltages and bias currents to the amplifying operation transistor. The bias circuit 110 is composed of a (second) transistor 102, a (third) transistor 103, a capacitor 104, a resistor 105, and a resistor 106. The transistors 102, 103 and the amplifying operation transistor 101 constitute a current mirror circuit. Therefore, this circuit configuration is resistant to variations in transistor characteristics due to process variation.

The bias circuit 110 is a bias circuit constituting a current mirror circuit having the amplifying operation transistor 101 and a feedback circuit whose feedback loop contains a low-pass filter 111 having the capacitor 104 one end of which is directly grounded. The capacitor 104 with one end thereof directly grounded serves as a shunt circuit for the feedback loop. The value of an operating current of the amplifying operation transistor 101 is determined by the resistors 106 and 105.

The feedback loop is a connection path composed of a connection from the emitter of the transistor 103 to the base of the transistor 102, a connection from the collector of the transistor 102 to the base of the transistor 103, and connections within the transistors 102 and 103, and constitutes a feedback loop of the bias circuit including the transistors 102 and 103.

That is, the high-frequency amplifier of this embodiment has a bias circuit including an input terminal and an output terminal for high-frequency signals; a high-frequency amplifier transistor with the base thereof connected to the input terminal; and a bias circuit that biases the base of the high-frequency amplifier transistor and has a feedback loop constituting a current mirror circuit together with the high-frequency amplifier transistor, and a low-pass filter including a capacitor is inserted in the feedback loop of the bias circuit. This capacitor constitutes at least part of the shunt circuit for grounding the feedback loop. This is the same for the other embodiments.

The bias circuit 110 substantially suppresses the feedback of a high-frequency signal by having in a feedback loop a low-pass filter 111 having the capacitor 104 one end of which is directly grounded, and maintains the voltage at bias point 120 constant by causing the transistor 103 to operate as an emitter follower that is stable for high frequencies.

The present invention is characterized in that a shunt circuit is formed by grounding one end of the capacitor 104.

Although the shunt circuit is formed by the capacitor 104 in FIG. 1, it is sufficient that the capacitor 104 constitutes at least part of the shunt circuit to ground the feedback loop.

Figure 2:
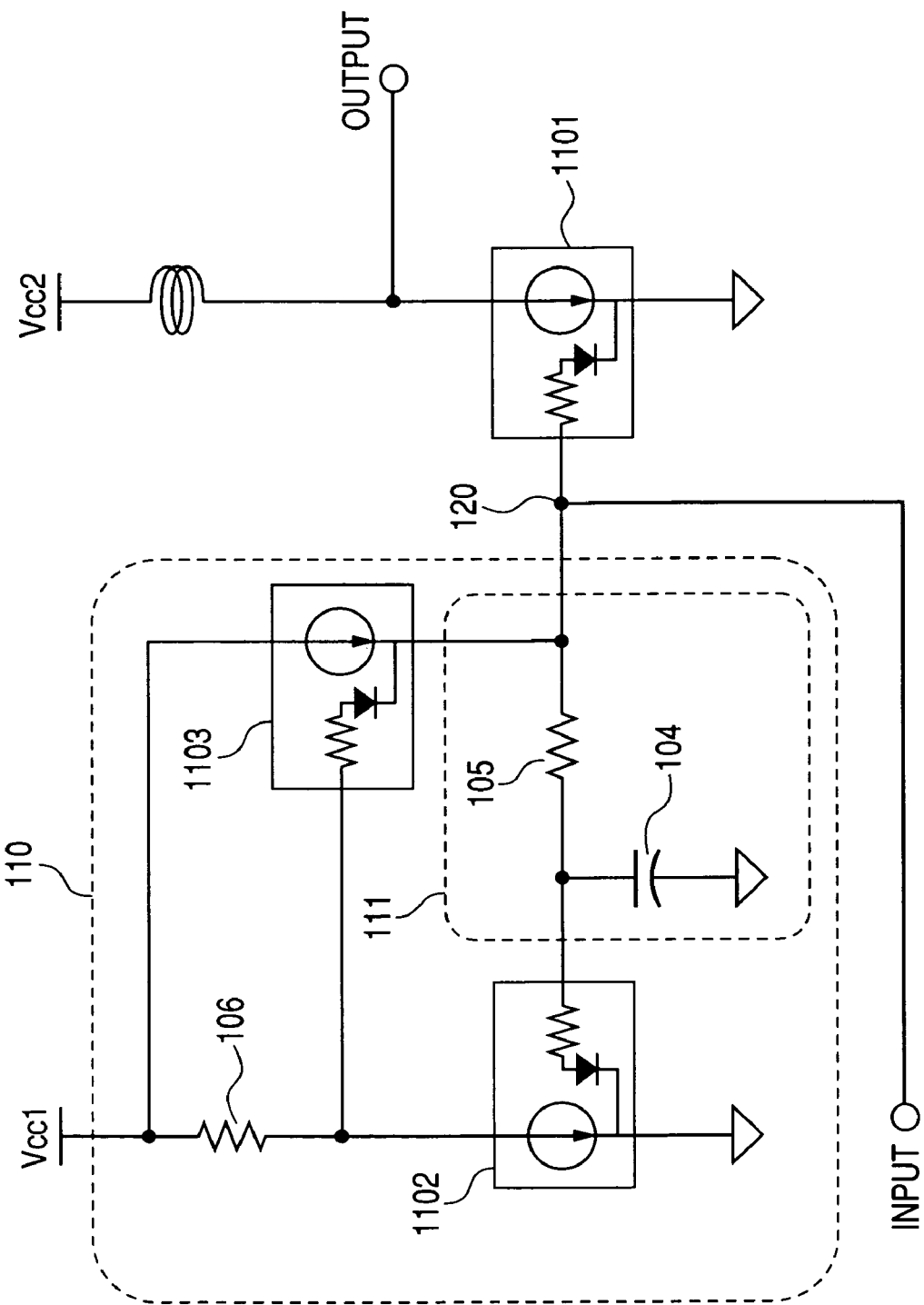
FIG. 2 is a diagram showing a large signal equivalent circuit of the first embodiment.

FIG. 2 shows a large signal equivalent circuit of the present invention. According to this embodiment, there is no resistor component connected in series with the capacitor 104 between the connection point with the capacitor 104, which is one end of the resistor 105 and the output end of the low-pass filter 111, and the ground. Therefore, the output point of the low-pass filter 111 is sufficiently connected to the ground during the large signal operation. Because of this, it is possible to feed a large signal current at controlled potential to the bias point 120 even during a large signal operation. This solves the abovementioned problem and achieves a stable bias.

Meanwhile, "there is no resistor connected in series with the capacitor 104" means that there is no resistor element connected in series with the capacitor 104.

In addition, assuming that the cutoff frequency of the low-pass filter 111 is $f_C$ and the lower limit over an optimal range of the cutoff frequencies is $f_L$ and the upper limit is $f_H$, it is preferable to design $f_L$ to be at least two or more times the modulation frequency bandwidth of a high-frequency input signal, and $f_H$ to be equal or less than the frequency of a high-frequency input signal.

Take the 11a standard of a wireless LAN employing the OFDM scheme as an example, $f_H$ is a frequency in the 5 GHz band. Also, in the 11a standard, the modulation bandwidth is about 20 MHz and $f_L$ is 40 MHz to 60 MHz.

That is, it is sufficient that $f_L$ is at least twice or more (40 MHz or more), preferably three times or more (60 MHz or more), the modulation frequency range of high-frequency input signals.

That is, in the low-pass filter 111 composed of the capacitor 104 and the resistor 105, it is possible to control the gain characteristics and thereby achieve high linearity by properly regulating the cutoff frequency $f_C$ within the range between $f_L$ and $f_H$.

Thus, according to this embodiment, since one end of the low-pass filter 111 in a feedback loop of the bias circuit 110 is directly grounded via a shunt circuit, the amount of attenuation of an input signal in the high-frequency band is sufficiently large and no feedback occurs, resulting in the base of the transistor 102 being stable for DC. This causes the transistor 103 to become a stable emitter follower operation state to achieve a constant voltage bias operation. In particular, during the large signal operation in which input signals become large, when the input amplitude is shifted in the positive direction the transistor 103 turns off and the impedance increases, which causes input signals to be input to the amplifier transistor 101, making it possible to achieve a sufficient amplifying operation. Also, when the amplitude is shifted in the negative direction, the transistor 103 appears as an emitter follower circuit and the voltage is maintained constant, and consequently no voltage drop in bias potential occurs and thereby the gain reduction phenomenon is suppressed, thus making it possible to achieve high linearity.

For analog signals in the OFDM digital modulation system, for example, a peak power value becomes as high as 26 dB while an average power value is 18 dB according to the wireless LAN 11a. Even for those analog signals having such a large amplitude and high frequencies, the high-frequency amplifier of the present invention can achieve the amplification with high linearity. In addition, the third harmonic distortion thereof is small.

Figure 3:
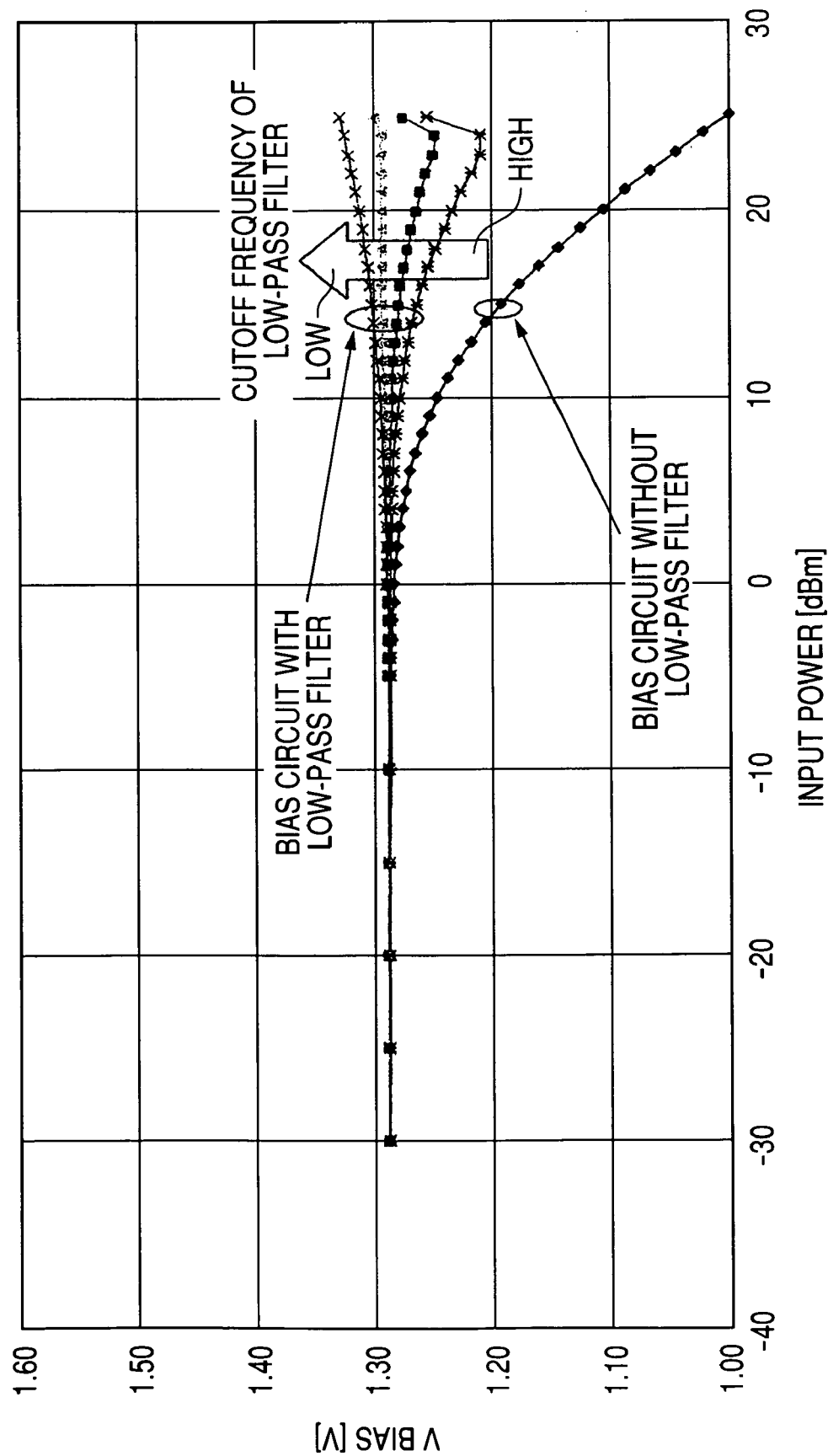
FIG. 3 is a graph showing the dependency of voltage Vbias [V] on input power [dBm] of the first embodiment.

FIG. 3 is the result of having confirmed by simulation the relationship between the voltage Vbias and the gain at the bias point 120 with respect to the magnitude of each input signal, when there is no shunt circuit including the capacitor 104 and when the cutoff frequency of the low-pass filter is changed by changing the capacitor value in the shunt circuit in the embodiment of FIG. 1. It can be seen that potential drop of the voltage Vbias at the bias point 120 against the increase in input signal is suppressed by having a low-pass filter composed of a capacitor one end of which is grounded to the feedback loop. Also, it can be seen that the voltage Vbias is increased depending on the condition of the cutoff frequency of the low-pass filter.

The variation range of the capacitor 104 in FIG. 3 is 2 to 10 pF and the resistor 105 is 100Ω. The lines in the graph for the bias circuit having a low-pass filter correspond to capacitor values 2 pF, 3 pF, 6 pF, and 10 pF respectively from the bottom up on the right of the figure. At this time, it is possible to make the voltage change at the bias point (output voltage of the bias circuit) 35 mV or less when the input signal is changed from −10 dBm to +17 dBm. When the capacitor value of the shunt circuit is within the range of 3 to 10 pF, the voltage change is 15 mV or less. The high-frequency input signal at this time is a signal in the 5 GHz band (frequency band used for the 11a), and the variation range of the cutoff frequency of the low-pass filter is about 150 MHz to 800 MHz. Also, it can be seen that the low-pass filter has the effect of increasing the voltage Vbias depending on the condition (when the capacitor value of the shunt circuit is 6 pF or more, for example) of the cutoff frequency of the low-pass filter.

Figure 4:
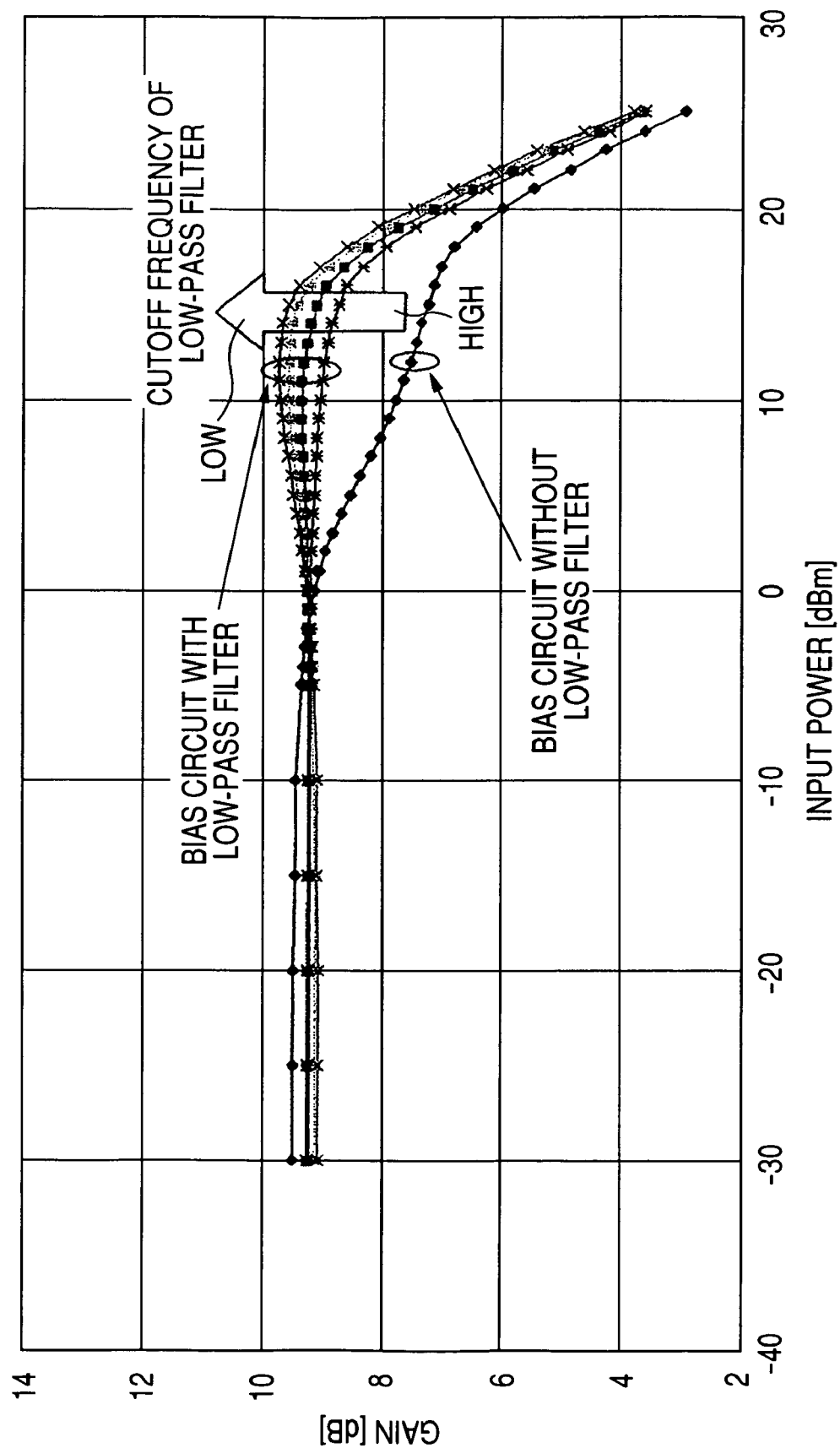
FIG. 4 is a graph showing the gain [dB] characteristics for input power [dBm]

Furthermore, as can be seen from FIG. 4, it is possible to control the gain characteristics for input signals by setting the cutoff frequency properly within the range from $f_L$ to $f_H$.

That is, as can be seen from FIG. 4, the gain drop is also reduced and high linearity is achieved. Also, it can be seen that the gain is increased depending on the condition of the cutoff frequency of the low-pass filter.

The variation range of the capacitor 104 of FIG. 4 is 2 to 10 pF and the resistor 105 is 100Ω. The lines in the graph for the bias circuit with a low-pass filter correspond to capacitor values 2 pF, 3 pF, 6 pF, and 10 pF respectively from the bottom up on the right of the figure. At this time, it is possible to make the gain change 1 dB or less when the input signal changes from −10 dBm to +17 dBm by making the voltage change at the bias point (output voltage of the bias circuit) 35 mV or less when the input signal is changed from −10 dBm to +17 dBm. Also, it can be seen that the low-pass filter has the effect of increasing the gain depending on the condition (when the capacitor value of the shunt circuit is 6 pF or more, for example) of the cutoff frequency of the low pass filter.

Also, when a high-frequency signal is positively shifted, the transistor 103 turns off and the bias side impedance becomes high impedance, suppressing the leakage of high-frequency signals to the bias circuit.

The abovementioned configuration of the embodiment realizes a high-frequency amplifier having a small-sized circuit and high linear characteristics.

Thus, the high-frequency amplifier of the present invention not only allows high linear characteristics to be realized with a single-stage of amplifier, but also has the property of controlling the increase and decrease of the gain in response to the increase of input signals. From this, it is also possible to achieve improved linearity by connecting two or more stages of high-frequency amplifiers of the present invention.

According to the embodiment, it is possible to provide a high-frequency amplifier and a high-frequency module having a small-sized circuit that is easy to integrate without increasing the circuit size, and also has high linearity for a wide range of input signals.

Second Embodiment

The low-pass filter of the first embodiment has the same effect even for the base input capacitor 130 of the transistor 102 instead of the capacitor 104. Also, the same effect can be obtained by connecting one end of the capacitor 104 to the emitter of the transistor 102 instead of the ground, as with a parasitic capacitor in a transistor.

Figure 5:
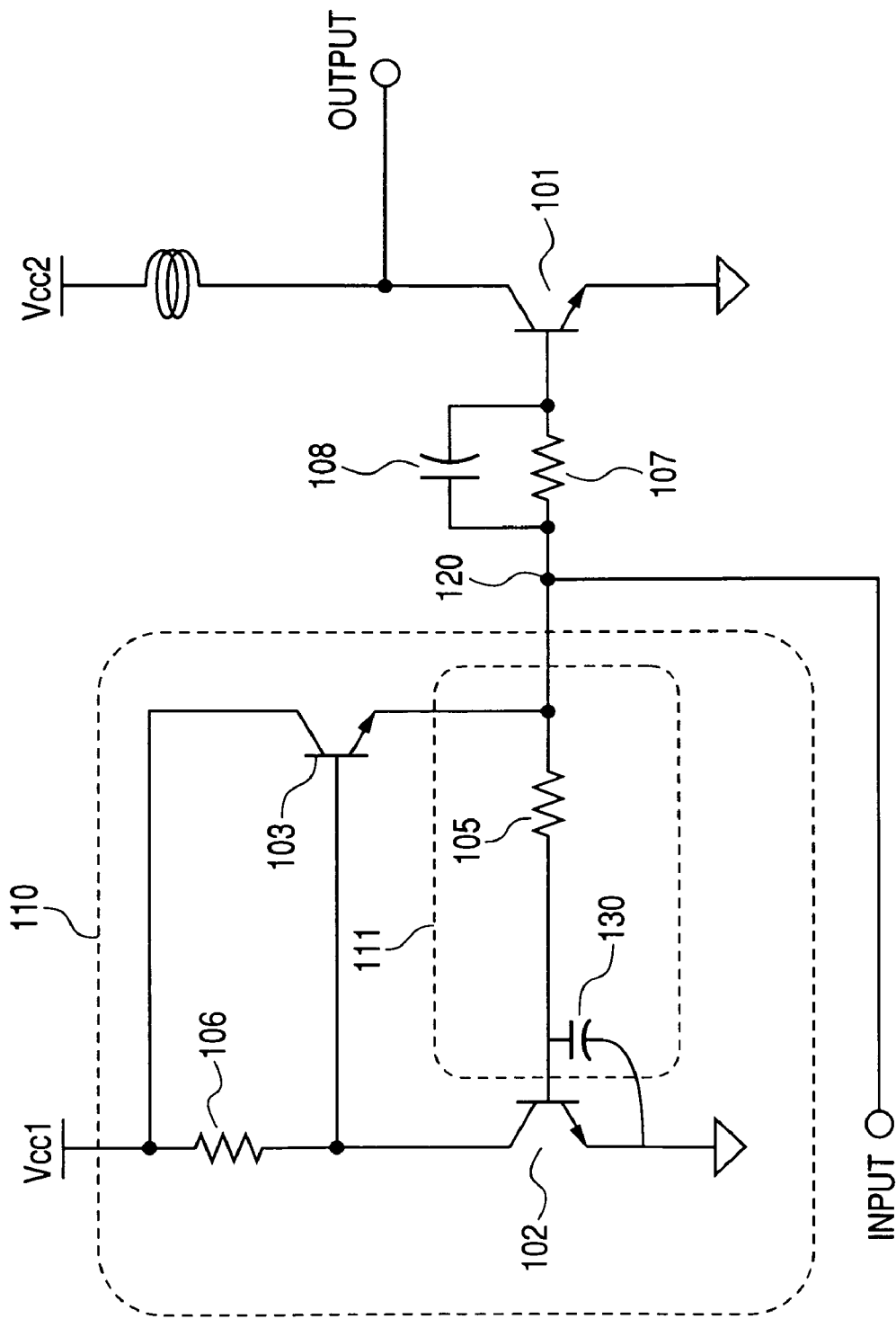
FIG. 5 is a diagram showing a configuration of a high-frequency amplifier according to a second embodiment of the present invention.

FIG. 5 is diagram showing a second embodiment. This embodiment is a high-frequency amplifier including a bias circuit 110 composed of an amplifying operation transistor, transistors 102 and 103, and resistors 105 and 106, which is basically the same as the first embodiment.

The amplifying operation transistor 101 and the transistors 102 and 103 constitute a current mirror circuit and hence this circuit configuration is resistant to variations in transistor characteristics due to process variation. The bias current of the amplifying operation transistor 101 is determined by the resistors 105 and 106. Also, it is possible to further downsize the circuit by making up the low-pass filter with the resistor 105 and the base input capacitor 130 of the transistor 102 and thereby making a capacitor element unnecessary. The parallel connection circuit composed of a resistor 107 and a capacitor 108 is an example of the ballast circuit to prevent a thermo-runaway of the transistor 101 and has the same effect if this circuit is used in the first embodiment.

The ballast circuit is present between the emitter of the third transistor and the base of the first transistor and is connected between the input terminal and the base of the first transistor. This is the same for subsequent embodiments described below.

As to the relationship between the base input capacitor 130 and the parasitic capacitor in a transistor, specifically the major parasitic capacitor as the base input capacitor 130 is a base-emitter parasitic capacitor between the base and the emitter, and the parasitic capacitor in the transistor is this base-emitter parasitic capacitor. Further, the input capacitor of the transistor that is practically used as the transistor 102 is at about several tens of fF to several hundreds of fF, and it is possible to realize the cutoff frequency that has been changed in FIG. 3 by making the value of the resistor 105 several kΩ to several hundreds of kΩ.

Thus, according to this embodiment, it is possible to provide a high-frequency amplifier and a high-frequency module having a small-sized circuit that is easy to integrate without increasing the circuit size, and also has high linearity for a wide range of input signals.

Third Embodiment

Figure 6:
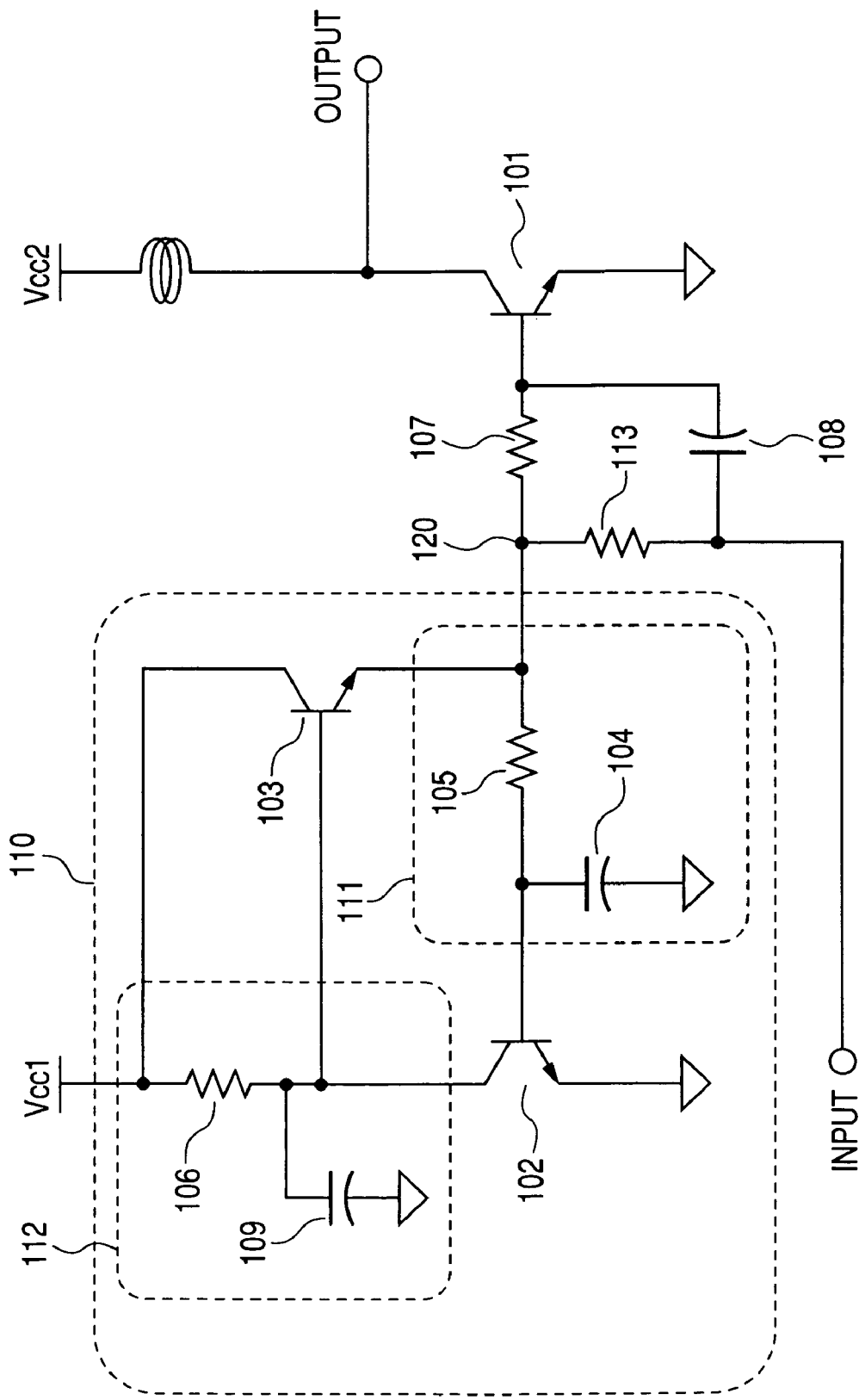
FIG. 6 is a diagram showing a configuration of a high-frequency amplifier according to a third embodiment of the present invention.

FIG. 6 is a diagram showing a third embodiment. In this embodiment, one end of the resistor 106 is grounded via the capacitor 109. Also, the emitter of the third transistor 103 and the base of the first transistor 101 are connected by a ballast circuit composed of a (second) resistor 107 connecting the emitter of the transistor 103 and the base of the transistor 101; a (third) resistor 113 connecting the input terminal and the emitter of the transistor 103; and the capacitor 108 connecting the input terminal and the base of the first transistor 101.

The ballast circuit composed of the resistor 107, 113 and the capacitor 108 as shown in FIG. 6 makes it possible to achieve a higher impedance for high-frequency signals as compared with the ballast circuit composed of the resistor 107 and the capacitor 108 as shown in FIG. 1 and to reduce the attenuation of high-frequency signals in the ballast circuit, by separating the signal path for DC voltages that biases the transistor 101 and the signal path for high-frequency signals as viewed from the bias circuit side.

In this embodiment, a second low-pass filter 112 composed of the resistor 106 and the capacitor 109 is further added into the feedback loop by adding the capacitor 109 one end of which is grounded. This further attenuates high-frequency signals and allows the emitter follower operation of the transistor 103 to be more stabilized. Also, the circuit composed of the resistors 107 and 113 and the capacitor 108 is another example of the ballast circuit shown in the second embodiment, and has the effect of preventing the thermo-runaway of transistor 101 even when it is applied to other embodiments.

Furthermore, the resistor 106 and the capacitor 109 constituting the abovementioned second low-pass filter are connected to the collector of the transistor 102, wherein high-frequency signals are transmitted as current signals from the collector of the transistor 102 and hence the second low-pass filter operates as a low-pass filter included in the abovementioned feedback loop of the bias circuit 110.

Thus, according to this embodiment, it is possible to provide a high-frequency amplifier and a high-frequency module having a small-sized circuit that is easy to integrate without increasing the circuit size, and also has high linearity for a wide range of input signals.

Fourth Embodiment

Figure 7:
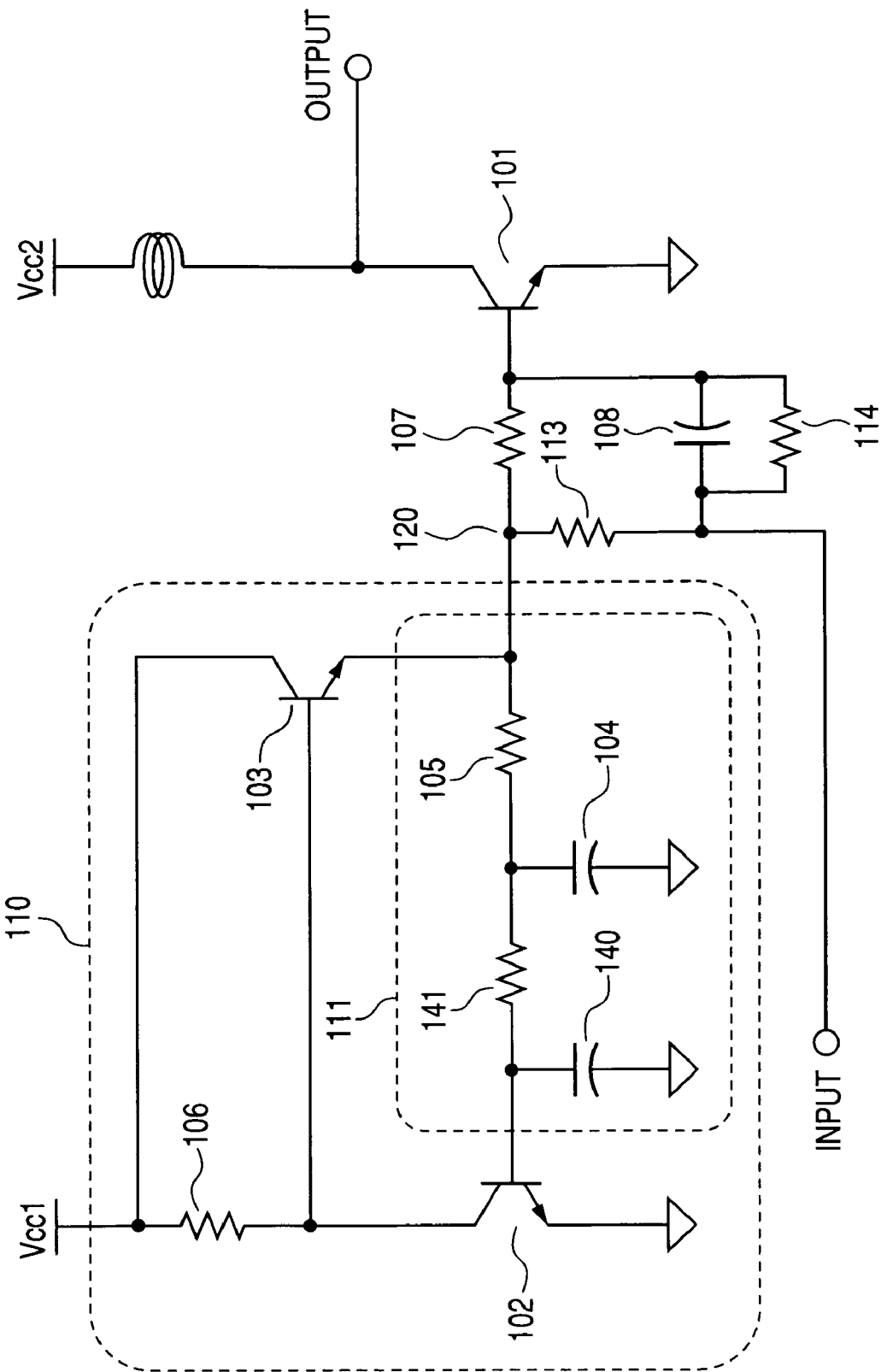
FIG. 7 is a diagram showing a configuration of a high-frequency amplifier according to a fourth embodiment of the present invention.

FIG. 7 is a diagram showing a fourth embodiment. This embodiment includes a feedback loop composed of a capacitor 140 and a resistor 141 in addition to the capacitor 104 and the resistor 105. Also, the emitter of the transistor 103 and the base of the transistor 101 are connected by a ballast circuit composed of the resistor 107 connecting the emitter of the transistor 103 and the base of the transistor 101; a resistor 113 connecting the input terminal and the emitter terminal of the transistor 103; a (fourth) resistor 114 connecting the input terminal and the base of the transistor 101; and the capacitor 108 connected in parallel with the resistor 114. That is, this embodiment includes two-staged low-pass filters composed of the capacitor 140 and the resistor 141 in addition to the capacitor 104 and the resistor 105 constituting the low-pass filter 111 of the bias circuit of the first embodiment. The fourth embodiment is another embodiment wherein the emitter follower operation of the transistor 103 is stabilized by attenuating high-frequency signals as with the third embodiment. Also, the circuit composed of the resistors 107, 113, and 114, and the capacitor 108 is an example of the ballast circuit having the same effect as the embodiments 2 and 3.

Thus, according to this embodiment, it is possible to provide a high-frequency amplifier and a high-frequency module having a small-sized circuit that is easy to integrate without increasing the circuit size, and also has high linearity for a wide range of input signals.

It is also possible to connect the resistor 141 instead of the capacitor 140 and resistor 141 constituting one stage of the two-staged low-pass filters shown in FIG. 7. Furthermore, it is possible to adjust bias currents flowing in the high-frequency amplifier transistor 101 and thereby increase the flexibility of design of the bias circuit without changing the value of the resistor 106 and the resistor 105 that determines the cutoff frequency of the low-pass filter, by adjusting the value of the resistor 141 connected between the one stage of low-pass filter including the capacitor 104 and the resistor 105 and the base of the transistor 102.

Fifth Embodiment

Figure 8:
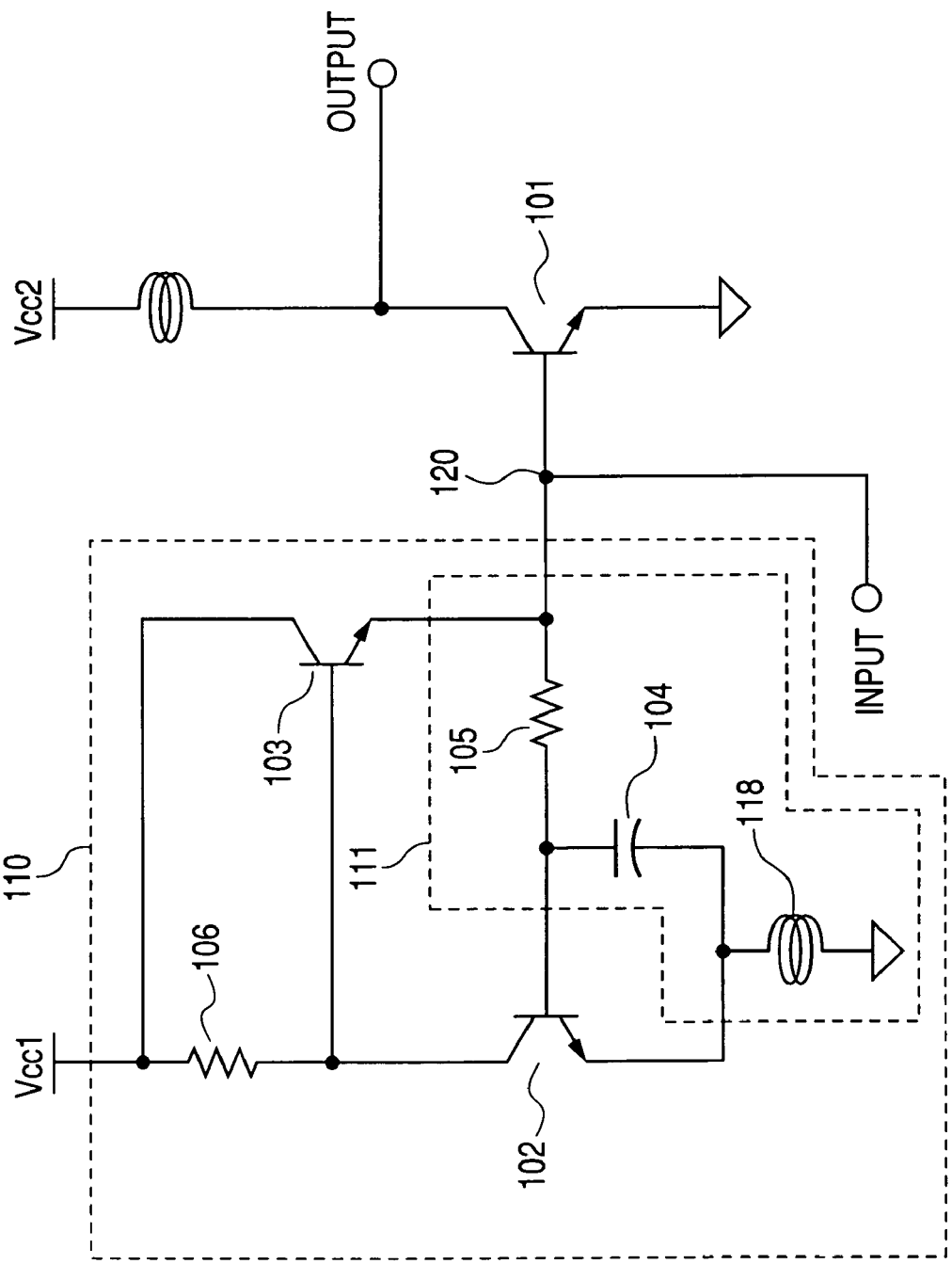
FIG. 8 is a diagram showing a configuration of a high-frequency amplifier according to a fifth embodiment of the present invention.

FIG. 8 is a fifth embodiment. The low-pass filter of the bias circuit 111 of each embodiment described above may include an inductor 118 in addition to the capacitor 104. The inductor 118 may be formed using back via or wire bond for an IC circuit. As an example, the capacitor is 100 pH or less and the inductor is 1 nH or less.

In the embodiment shown in FIG. 8, the emitter of the transistor 102 and the capacitor 104 are grounded via the common inductor 118 to simplify the configuration. It is also possible to ground the capacitor 104 and the emitter of the transistor 102 separately via different inductors. In addition, only the capacitor 104 may be grounded via an inductor.

Thus, by providing a low-pass filter including a shunt circuit that becomes a low impedance at communication frequencies within the feedback loop of a feedback circuit, it is possible to provide a high-frequency amplifier having high linear characteristics that is easy to integrate and resistant to variations in transistor characteristics due to process variation, without increasing the circuit size.

Sixth Embodiment

Figure 9:
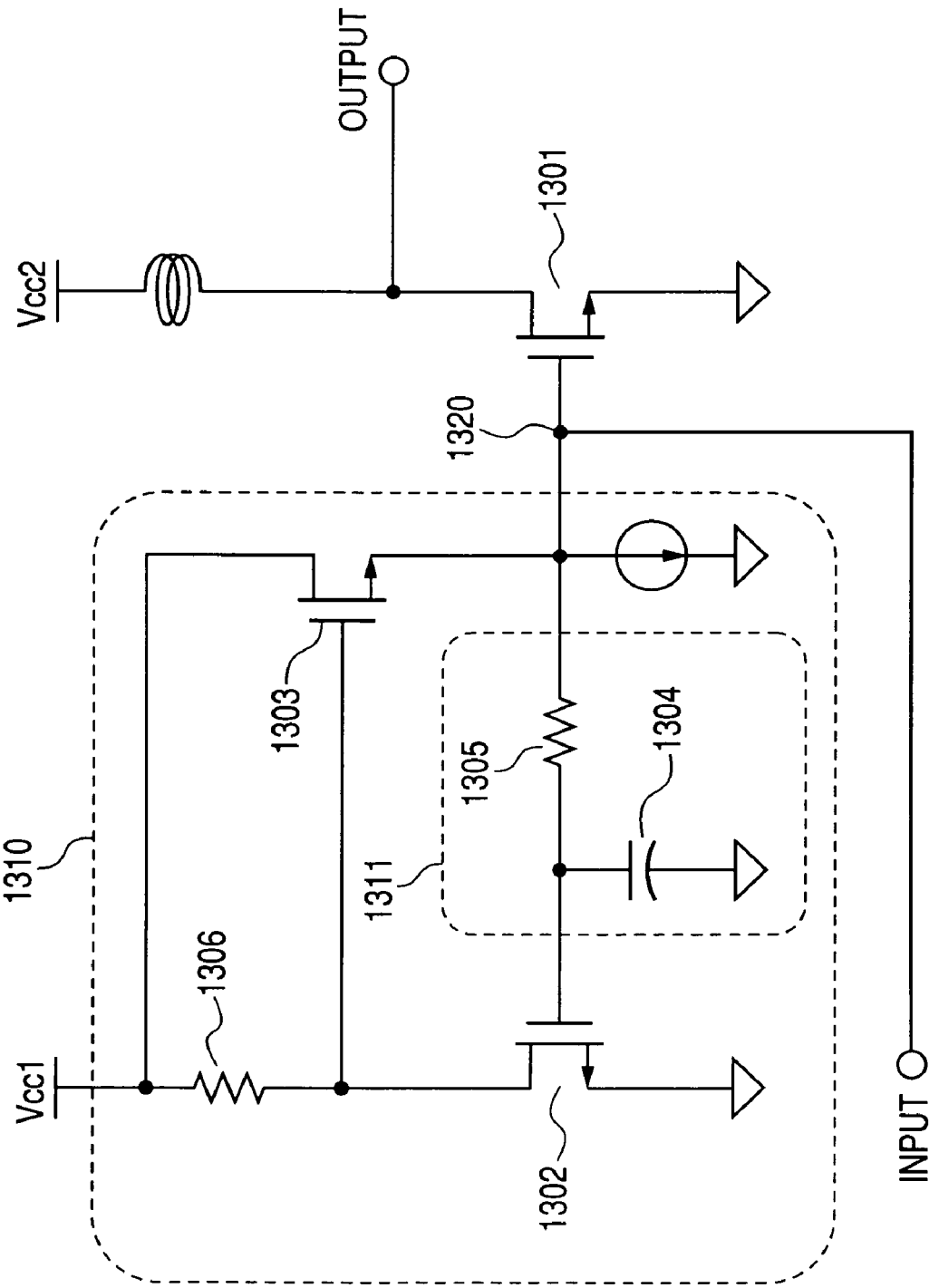
FIG. 9 is a diagram showing a configuration of a high-frequency amplifier according to a sixth embodiment of the present invention.
Figure 10:
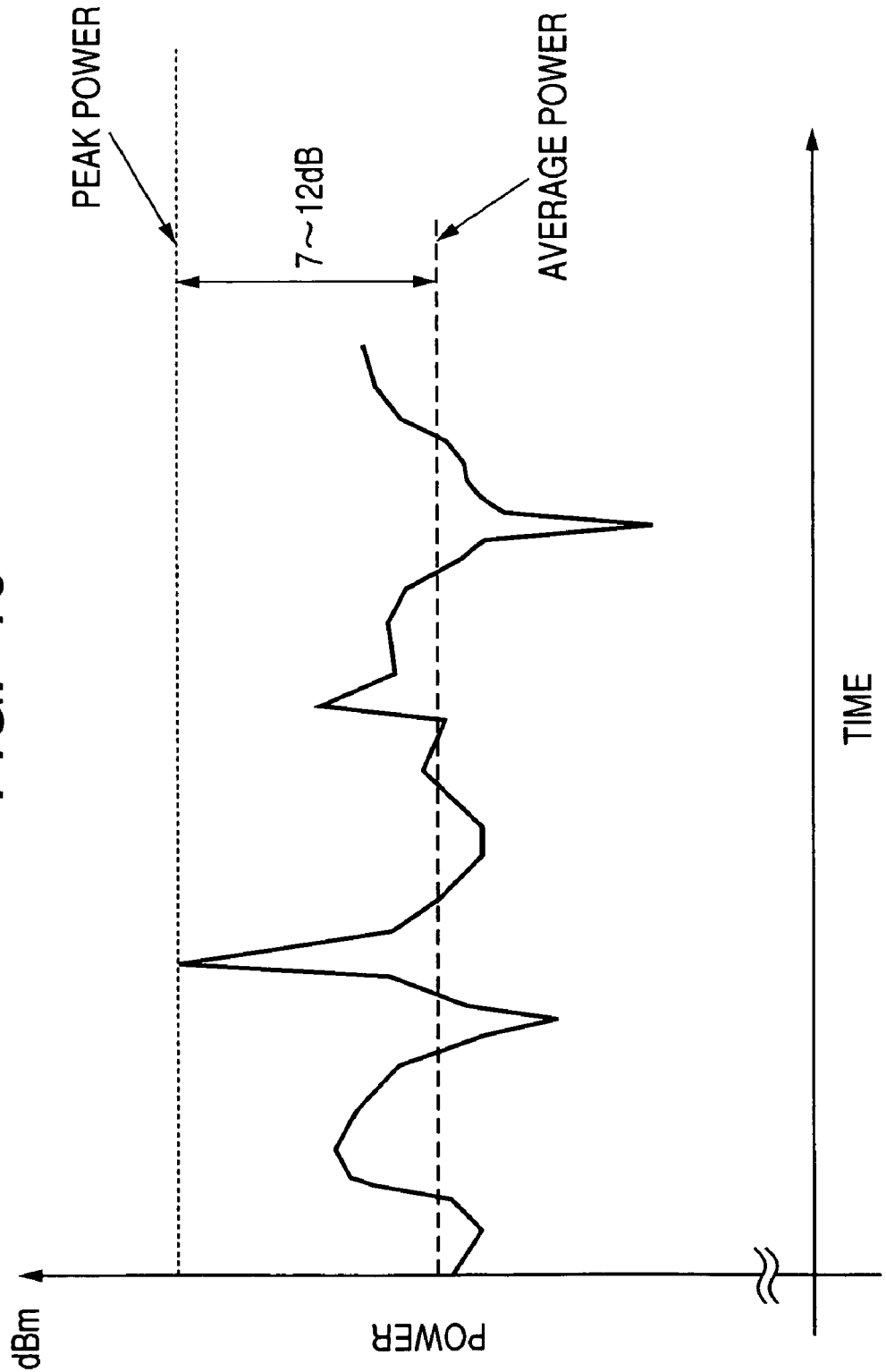
FIG. 10 is a graph showing an example of the time variation of a high-frequency signal power in the OFDM scheme.

FIG. 9 is a diagram showing a configuration of a high-frequency amplifier according to a sixth embodiment. The high-frequency amplifier of this embodiment has implemented the same configuration as the high-frequency amplifier of the first embodiment by using MOS transistors. That is, transistors 1301 to 1303 form a MOS structure and the operation and effect resulting from providing a low-pass filter 1311 is the same as in the first embodiment.

Seventh Embodiment

Also, it is possible to downsize communication apparatuses by mounting on or forming in a multi-layer dielectric substrate a semiconductor IC based on the high-frequency amplifier and the high-frequency low noise amplifier according to the present invention, high-frequency switch, and filter function to form into a high-frequency module.

Figure 11:
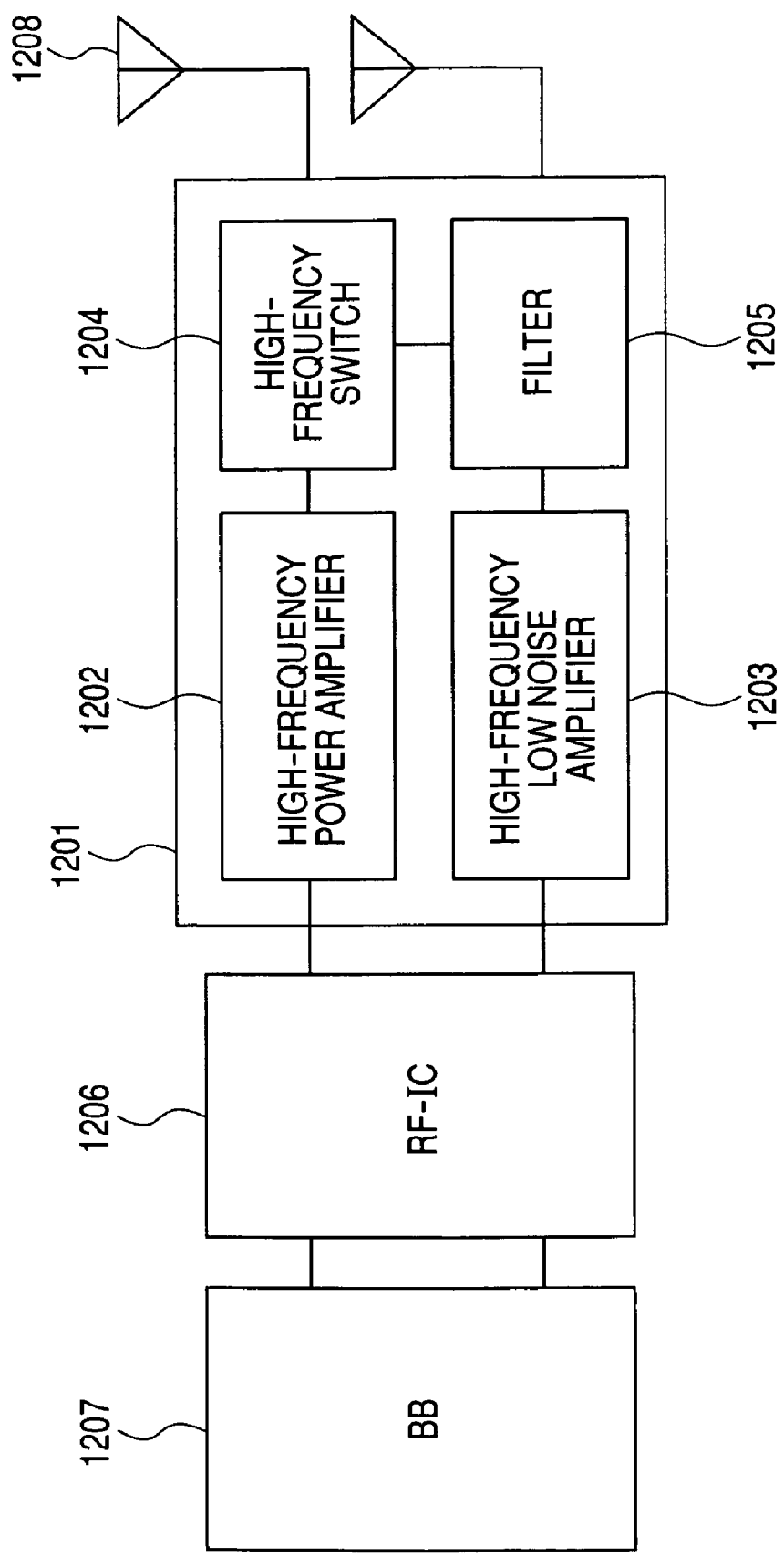
FIG. 11 is a functional block diagram showing an exemplary configuration of a mobile wireless apparatus including a high-frequency module according to a seventh embodiment of the present invention.
Figure 12:
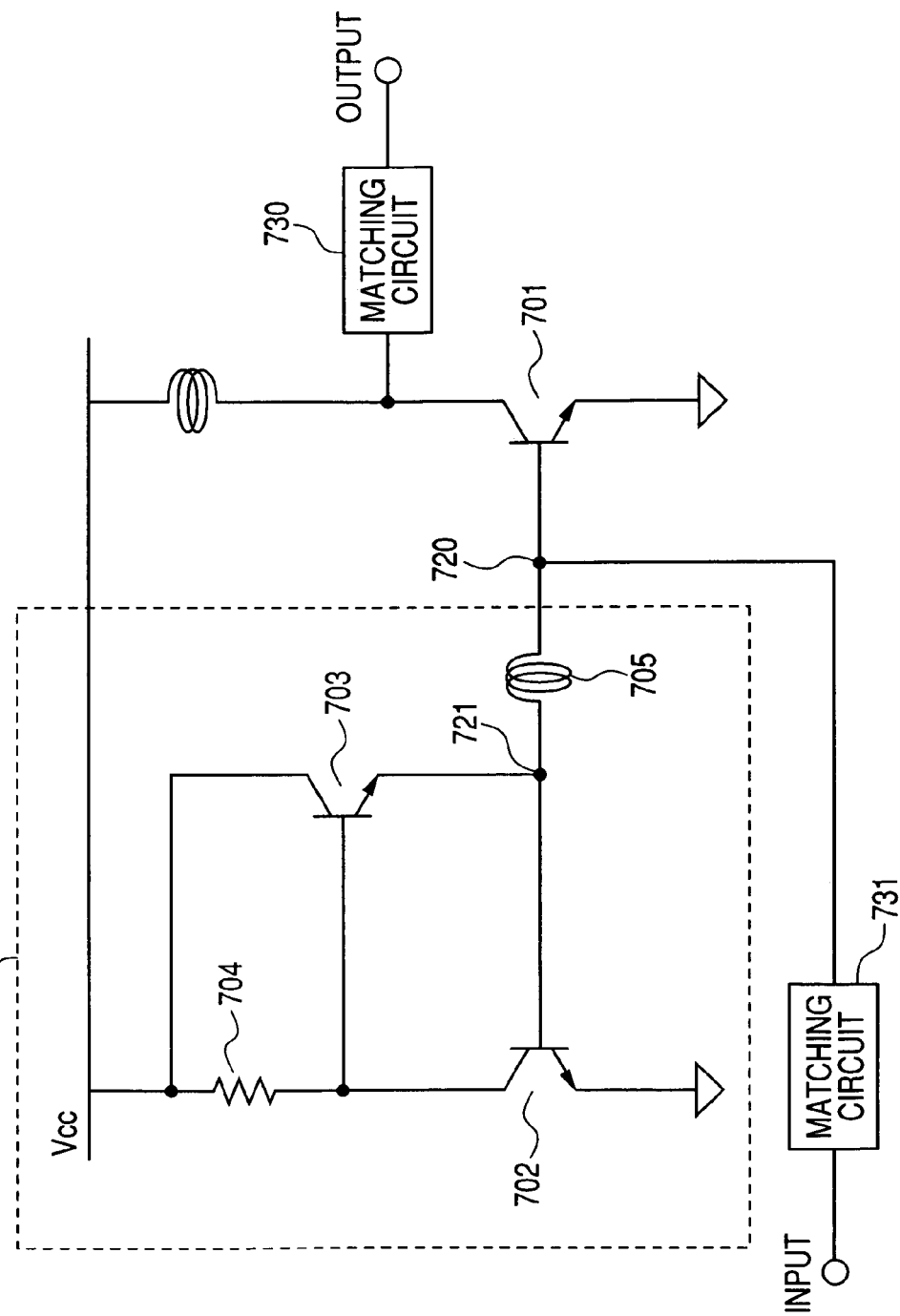
FIG. 12 is a diagram showing a conventional inductor bias feed circuit.
Figure 13:
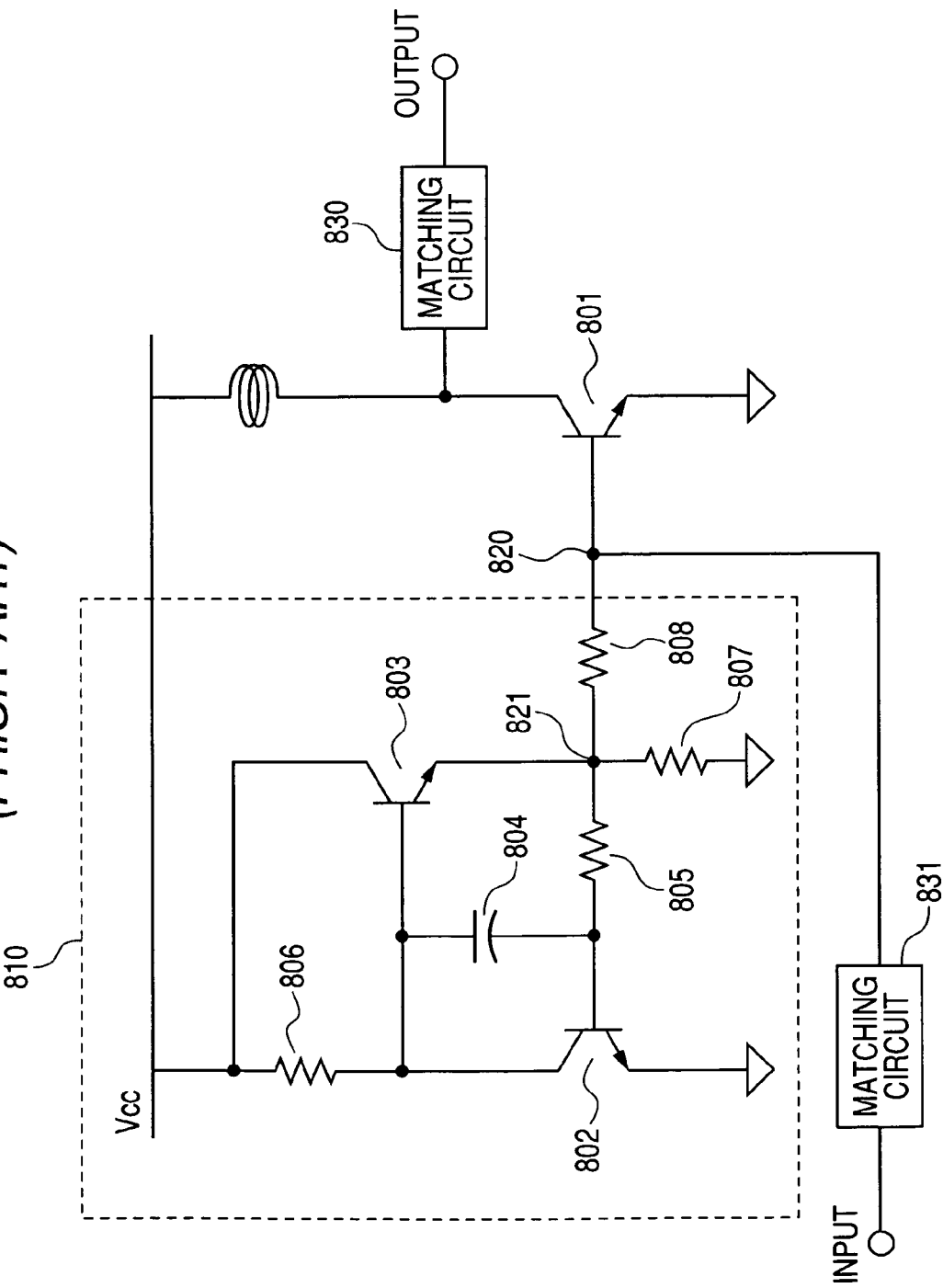
FIG. 13 is a diagram showing a conventional resistor bias feed circuit.
Figure 14:
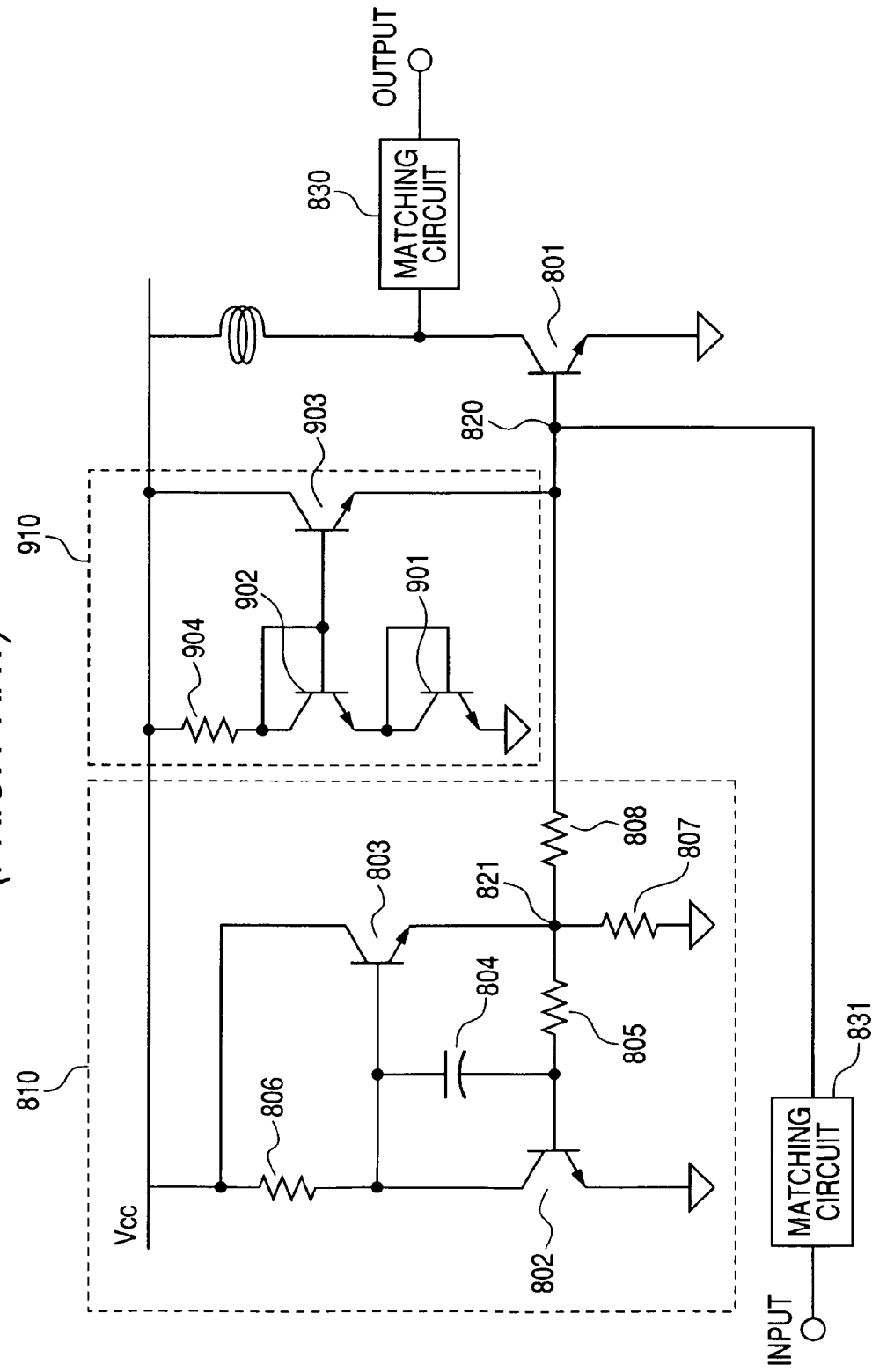
FIG. 14 is a diagram showing a conventional dual bias feed circuit.
Figure 15:
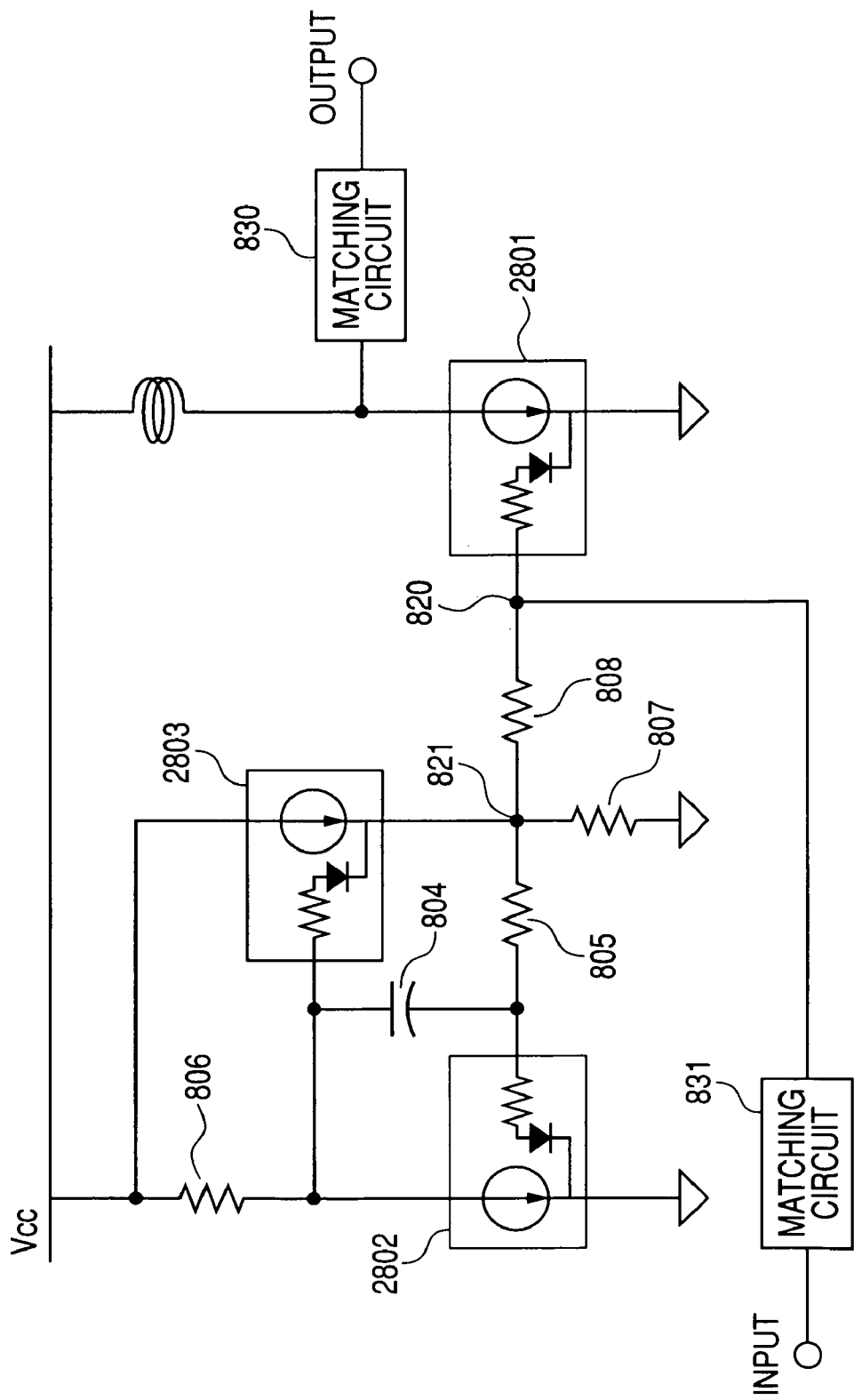
FIG. 15 is a diagram showing an equivalent circuit diagram during large signal operation of the resistor bias feed circuit shown in FIG. 13.

FIG. 11 is a functional block diagram showing an exemplary configuration of a mobile wireless apparatus provided with a high-frequency module according to a seventh embodiment.

A high-frequency module 1201 includes a high-frequency power amplifier 1202, a high-frequency low noise amplifier 1203, a filter 1205, and a high-frequency switch 1204, all of which are mounted on a multi-layer dielectric substrate to form into a module. The high-frequency switch 1204 performs the switching between the transmission path and the reception path of signals and is connected to an external antenna 1208.

Hereinafter the embodiment is concretely described. The high-frequency module 1201 is a module for performing wireless communications using radio waves based on the frequency multiplexed modulation system. The high-frequency amplifier 1202 and the high-frequency low noise amplifier 1203 are high-frequency amplifiers that amplify the signals in the transmission path and those in the reception path respectively. The high-frequency switch 1204 is connected to the external antenna 1204 via the transmission/ reception path, and changes the signal path by switching between the transmission path and the reception path.

Figure 16:
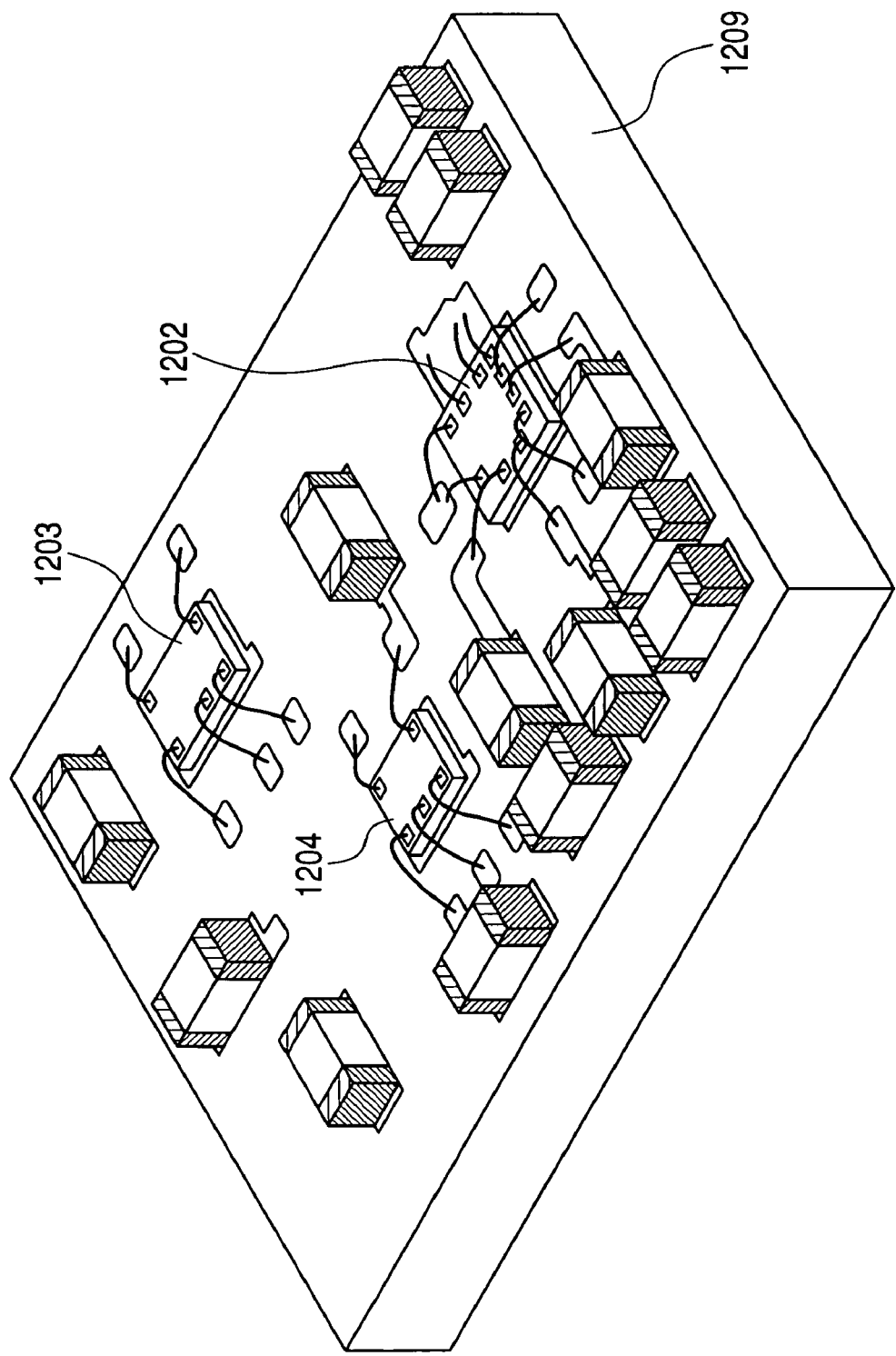
FIG. 16 is a perspective view of an embodiment of a high-frequency module according to the present invention.

FIG. 16 is a perspective view of the high-frequency module 1201 of this embodiment. The IC chips of the high-frequency power amplifier 1202, the high-frequency low noise amplifier 1203, and the high-frequency switch 1204 are mounted on a surface of the multi-layer dielectric substrate 1209, while the filter 1205 is formed inside the multi-layer dielectric substrate. The filter 1205 removes unwanted waves and/or interfering waves in a transmission signal. On the back of the multi-layer dielectric substrate, antenna terminals for connecting the transmission/reception paths of the high-frequency switch, a transmission terminal for inputting signals in the transmission path, a reception terminal for outputting signals in the reception path, and the like are provided. A ceramic or resin substrate is used as the multi-layer dielectric substrate 1209, for example. Also, part of the high-frequency amplifier to amplify signals in the transmission or reception path may be disposed at a place other than the multi-layer dielectric substrate constituting the high-frequency module.

The configuration of the high-frequency module is not limited to the configuration shown in FIG. 11. That is, it is possible to employ a high-frequency module which is composed of a high-frequency switch for switching between a transmission pass and a reception path and at least one high-frequency amplifier that amplifies high-frequency signals in the transmission path or high-frequency signals in the reception path, and which is adapted to perform wireless communications using radio waves based on the frequency multiplexed modulation system. The configuration of this embodiment is used for such a high-frequency amplifier. It is also possible to configure a high-frequency module for multi-band communications by providing a diplexer at the transmission and reception paths at the subsequent stage (i.e., opposite to the external antenna) of the high-frequency switch. In this case, the high-frequency amplifier can be used for every communication band.

The mobile wireless apparatus shown in FIG. 11 has a high-frequency module and an antenna; the high-frequency module is composed of a transmission unit including a high-frequency power amplifier and a modulation section, a reception unit including a high-frequency low noise amplifier and a demodulation section and a high-frequency switch; and the high-frequency power amplifier and the high-frequency low noise amplifier each having at least one high-frequency analog amplifier. The high-frequency power amplifier 1202 of the transmission unit and the high-frequency low noise amplifier 1203 of the reception unit are provided in the high-frequency module 1201. The modulation section and the demodulation section are contained in the FR-IC 1206 connected to the base band IC 1207.

The mobile wireless apparatus of this embodiment has a function of performing wireless communications using radio waves based on the frequency multiplexed modulation system employing the CDMA or OFDM scheme or an extended scheme thereof. The high-frequency module 1201 constitutes the analog front end of wireless apparatus, and the high-frequency power amplifier 1202 and the high-frequency low noise amplifier 1203 constitute a key block of the analog front end; any of the amplifiers of each embodiment described above is used as an amplifier that amplifies high-frequency analog signals.

In particular, it is preferable to use the high-frequency amplifier as a high-frequency power amplifier that amplifies transmission signals.

The mobile wireless apparatus is not limited to the configuration shown in FIG. 11. That is, it is sufficient that the mobile wireless apparatus for performing wireless communications using radio waves based on the frequency multiplexed modulation system is composed of a high-frequency switch to switch between a transmission path and a reception path; a high-frequency module including at least one high-frequency amplifier to amplify high-frequency signals in the transmission path or high-frequency signals in the reception path; a high-frequency signal modulation section; a high-frequency signal demodulation section; and an antenna. The abovementioned configuration is applied to such a high-frequency amplifier. Examples of the mobile wireless apparatus includes a cellular phone, a personal computer, and the like, but is not limited to them.

According to this embodiment, it is possible to provide a high-frequency module which has high linearity and the circuit of which is small due to ease of integration, and a mobile wireless apparatus using the same.

What is claimed is:

1. A high-frequency amplifier comprising:
   an input terminal and an output terminal for high-frequency signals;
   a high-frequency amplifier transistor with a base thereof connected to the input terminal; and
   a bias circuit that biases the base of the high-frequency amplifier transistor and has a feedback loop constituting a current mirror circuit together with the high-frequency amplifier transistor,
   wherein a low-pass filter including a capacitor is inserted in the feedback loop of the bias circuit, and
   wherein the capacitor constitutes at least part of a shunt circuit to ground the feedback loop.

2. The high-frequency amplifier according to claim 1, wherein one end of the capacitor is directly grounded.

3. The high-frequency amplifier according to claim 1, wherein one end of the capacitor is grounded via an inductor.

4. The high-frequency amplifier according to claim 1, wherein the capacitor is a base input capacitor of a transistor constituting part of the feedback loop.

5. The high-frequency amplifier according to claim 1, wherein the feedback loop includes a plurality of the low-pass filters.

6. The high-frequency amplifier according to claim 1, wherein a current mirror circuit is formed by a first transistor that functions as the high-frequency amplifier transistor and a bias circuit including the feedback loop composed of a second transistor and a third transistor,
   wherein a first resistor is provided that is connected between a control voltage or power supply and the feedback loop and that has a function of determining a bias current in a bias circuit having the feedback loop,
   wherein a collector of the second transistor is connected to one end of the first resistor and an emitter thereof is grounded, wherein a base of the third transistor is connected to one end of the first resistor, and
   wherein the feedback loop is formed by connecting the emitter of the third transistor to the base and collector of the second transistor and then to the base of the third transistor.

7. The high-frequency amplifier according to claim 6, wherein the low-pass filter that includes at least one capacitor one end of which is grounded or connected to the emitter of the second transistor is provided in the feedback loop.

8. The high-frequency amplifier according to claim 6, wherein including an inductor that one end of which is grounded and another end thereof is connected to the capacitor.

9. The high-frequency amplifier according to claim 6, wherein a collector of the first transistor is connected to the output terminal, and
wherein an emitter of the third transistor and a base of the first transistor are connected.

10. The high-frequency amplifier according to claim 7, wherein the collector of the first transistor is connected to the output terminal, and
wherein a ballast circuit having at least one resistor and one capacitor connected in parallel between the input terminal and the base of the first transistor is connected between the emitter of the third transistor and the base of the first transistor.

11. The high-frequency amplifier according to claim 9, wherein the emitter of the third transistor and the base of the first transistor are connected by a ballast circuit including:
a second resistor connecting the emitter of the third transistor and the base of the first transistor;
a third resistor connecting the input terminal and the emitter of the third transistor; and
a capacitor connecting the input terminal and the base of the first transistor.

12. The high-frequency amplifier according to claim 9, wherein the emitter of the third transistor and the base of the first transistor are connected by a ballast circuit comprising:
a second resistor connecting the emitter of the third transistor and the base of the first transistor;
a third resistor connecting the input terminal and the emitter of the third transistor;
a fourth resistor connecting the input terminal and the base of the first transistor; and
a capacitor connected in parallel with the fourth resistor.

13. The high-frequency amplifier according to claim 1, wherein the first transistor constituting the high-frequency amplifier transistor, and the second transistor and the third transistor constituting the feedback loop are MOS transistors.

14. A high-frequency module for performing wireless communications using radio waves based on the frequency multiplexed modulation system, comprising:
a high-frequency switch that switches between a transmission path and a reception path; and
at least one high-frequency amplifier that amplifies high-frequency signals in the transmission path or high-frequency, signals in the reception path, wherein the high-frequency amplifier includes:
an input terminal and an output terminal for high-frequency signals;
a high-frequency amplifier transistor a base of which is connected to the input terminal;
a bias circuit that biases the base of the high-frequency amplifier transistor and constitutes a current mirror circuit together with the high-frequency amplifier transistor; and
a low-pass filter having a shunt circuit that is inserted in a feedback loop of the bias circuit and becomes a low impedance at communication frequencies used for the wireless communications.

15. The high-frequency module according to claim 14, wherein the shunt circuit includes a capacitor one end of which is grounded.

16. The high-frequency module according to claim 14, wherein the shunt circuit includes a capacitor one end of which is grounded via an inductor.

17. The high-frequency module according to claim 14, wherein the frequency multiplexed modulation system is the OFDM modulation scheme, and
wherein the high-frequency amplifier is mounted on a multi-layer dielectric substrate to form into a module.

18. A mobile wireless apparatus for performing wireless communications using radio waves based on the frequency multiplexed modulation system, comprising:
a high-frequency module having a high-frequency switch that switches between a transmission path and a reception path and at least one high-frequency amplifier that amplifies high-frequency signals in the transmission path or high-frequency signals in the reception path;
a high-frequency signal modulation section;
a high-frequency signal demodulation section; and
an antenna, wherein the high-frequency amplifier includes:
an input terminal and an output terminal for high-frequency signals;
a high-frequency amplifier transistor of which a base is connected to the input terminal;
a bias circuit that biases the base of the high-frequency amplifier transistor and has a feedback loop constituting a current mirror circuit together with the high-frequency amplifier transistor; and
a low-pass filter having a shunt circuit that is inserted in the feedback loop of the bias circuit and becomes a low impedance at communication frequencies used for the wireless communications.

19. The mobile wireless apparatus according to claim 18, wherein the frequency multiplexed modulation system is the OFDM modulation scheme, and
wherein the high-frequency module is mounted on a multi-layer dielectric substrate to form into a module.

20. The mobile wireless apparatus according to claim 18, wherein the low-pass filter includes a capacitor, and
wherein the capacitor constitutes part of the shunt circuit to ground the feedback loop.

21. A high-frequency amplifier comprising:
an input terminal and an output terminal for high-frequency signals;
a high-frequency amplifier transistor with a base thereof connected to the input terminal; and
a bias circuit that biases the base of the high-frequency amplifier transistor and has a feedback loop constituting a current mirror type circuit together with the high-frequency amplifier transistor,
wherein the current mirror type circuit is formed by a first transistor that functions as the high-frequency amplifier transistor, a second transistor, and a third transistor,
wherein the feedback loop is formed by connecting the emitter of the third transistor to the base and collector of the second transistor and then to the base of the third transistor,
wherein a low-pass filter including a second resistor and a capacitor are inserted in the feedback loop of the bias circuit,
wherein the capacitor constitutes at least part of a shunt circuit to ground the feedback loop, and
wherein one end of the capacitor is connected to a node positioned between the base of the second transistor and the second resistor.

* * * * *